US006627477B1

(12) United States Patent
Hakey et al.

(10) Patent No.: US 6,627,477 B1
(45) Date of Patent: Sep. 30, 2003

(54) METHOD OF ASSEMBLING A PLURALITY OF SEMICONDUCTOR DEVICES HAVING DIFFERENT THICKNESS

(75) Inventors: Mark C. Hakey, Fairfax, VT (US); Steven J. Holmes, Milton, VT (US); David V. Horak, Essex Junction, VT (US); Harold G. Linde, Richmond, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 09/657,232

(22) Filed: Sep. 7, 2000

(51) Int. Cl.⁷ .................. H01L 21/44; H01L 21/48; H01L 21/50
(52) U.S. Cl. ............ 438/106; 438/107; 438/127; 438/118
(58) Field of Search ............... 438/106, 107, 438/127

(56) References Cited

U.S. PATENT DOCUMENTS

| | | | | |
|---|---|---|---|---|
| 3,903,590 A | * | 9/1975 | Yokogawa | 438/107 |
| 4,231,154 A | | 11/1980 | Gazdik et al. | |
| 4,466,181 A | * | 8/1984 | Takishima | 438/107 |
| 4,941,255 A | * | 7/1990 | Bull | 156/235 |
| 4,975,143 A | * | 12/1990 | Drake et al. | 156/299 |
| 4,989,068 A | | 1/1991 | Yasuhara et al. | |
| 4,999,077 A | * | 3/1991 | Drake et al. | 156/299 |
| 5,012,323 A | | 4/1991 | Farnworth | |
| 5,045,142 A | * | 9/1991 | Drake et al. | 156/278 |
| 5,071,792 A | | 12/1991 | VanVonno et al. | |
| 5,087,658 A | * | 2/1992 | Nishizawa et al. | 524/538 |
| 5,319,243 A | | 6/1994 | Leicht et al. | |
| 5,353,498 A | * | 10/1994 | Fillion et al. | 29/840 |
| 5,377,031 A | | 12/1994 | Vu et al. | |
| 5,401,536 A | * | 3/1995 | Shores | 427/294 |
| 5,463,246 A | * | 10/1995 | Matsunami | 257/621 |
| 5,582,858 A | | 12/1996 | Adamopoulos et al. | |
| 5,593,917 A | * | 1/1997 | Nuyen | 438/107 |
| 5,668,569 A | | 9/1997 | Greene et al. | |
| 5,700,581 A | | 12/1997 | Sachdev et al. | |
| 5,757,620 A | | 5/1998 | Edwards et al. | |
| 6,046,072 A | * | 4/2000 | Matsuura et al. | 438/106 |
| 6,114,188 A | * | 9/2000 | Oliver et al. | 438/107 |
| 6,306,680 B1 | * | 10/2001 | Fillion et al. | 438/106 |
| 6,429,045 B1 | * | 8/2002 | Furukawa et al. | 438/107 |

OTHER PUBLICATIONS

IBM Technical Disclosure Bulletin, High Performance Package with Conductive Bonding to Chips, Coombs et al., vol. 22, No. 10. Mar. 1980, 2 pages.
1996 IEEE MTT–S Digest, Multichip–on–Flex Plastic Encapsulated MHDI–Low Cost Substrateless Manufacturing for Microwave and Millimeterwave Modules, Cooper et al., 7 pages.

* cited by examiner

*Primary Examiner*—John F. Niebling
*Assistant Examiner*—Angel Roman
(74) *Attorney, Agent, or Firm*—Schmeiser, Olsen & Watts; Mark F. Chadurjian

(57) ABSTRACT

The present invention provides a method of forming an integrated semiconductor device, and the device so formed. An active surface of at least two semiconductor devices, such as semiconductor chips, are temporarily mounted onto an alignment substrate. A support substrate is affixed to a back surface of the devices using a conformable bonding material, wherein the bonding material accommodates devices having different dimensions. The alignment substrate is then removed leaving the devices wherein the active surface of the devices are co-planar.

26 Claims, 3 Drawing Sheets

METHOD OF ASSEMBLING A PLURALITY OF SEMICONDUCTOR DEVICES HAVING DIFFERENT THICKNESS

BACKGROUND OF THE INVENTION

1. Technical Field

The present invention relates generally to the manufacture of semiconductor packaging, and more particularly, to incorporating multiple functions onto a single semiconductor device.

2. Related Art

As the semiconductor industry continues to scale down semiconductor devices, it is becoming desirable to incorporate multiple functions into each device, thereby forming a "system-on-a-chip." However, the level of integration required to manufacture such a device is difficult due to the various requirements, as well as the differences in the size and shape of each component that makes up the integrated device. Accordingly, there exists a need in the industry for a method of manufacturing an integrated semiconductor device that solves the problems associated with "system-on-a-chip" fabrication.

SUMMARY OF THE INVENTION

The first general aspect of the present invention provides a method of assembling a plurality of semiconductor devices such that active surfaces of the devices are co-planar, comprising: providing a first substrate having a substantially planar surface; temporarily mounting the active surfaces of the plurality of devices on the substantially planar surface of the first substrate; attaching a second substrate, having a conformable bonding material thereon, to exposed surfaces of the plurality of devices; and removing the first substrate.

The second general aspect of the present invention provides a method of forming a semiconductor device, comprising: providing a first substrate having a substantially planar surface; temporarily mounting a first surface of a plurality of semiconductor devices to the planar surface of the first substrate; providing a second substrate having a conformable bonding material on an attachment surface of the second substrate; joining the first and second substrates, such that the bonding material adheres to a second surface of the semiconductor devices, and wherein the bonding material deforms to accommodate differences in size of the devices; and removing the first substrate from the first surface of the semiconductor devices, such that the devices maintain a substantially co-planar first surface.

The third general aspect of the present invention provides a semiconductor device, comprising: a substrate having a conformable bonding material on a surface of the substrate; and a plurality of chips, having different sizes, affixed to the bonding material of the substrate, wherein exposed active surfaces of the chips are co-planar.

The fourth general aspect of the present invention provides a semiconductor package, comprising a substrate having at least two chips mounted thereon, wherein the at least two chips perform different functions within the semiconductor package, and wherein an active surface of the at least two chips are planar and extend away from the substrate.

The foregoing and other features of the invention will be apparent from the following more particular description of the embodiments of the present invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1A:
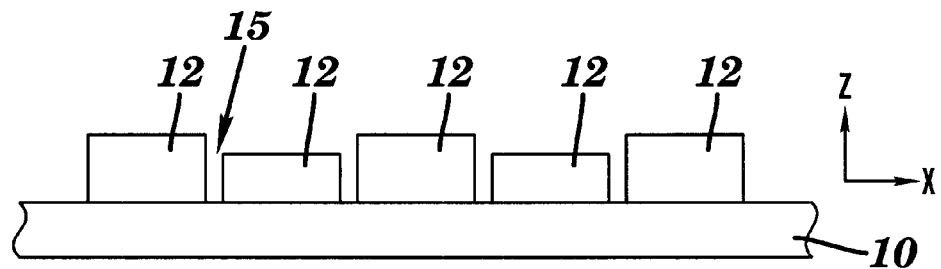
FIG. 1A depicts a cross-sectional view of an alignment substrate having a plurality of chips temporarily attached thereto.

Referring to the drawings, FIG. 1A shows a cross-sectional view of a template or alignment wafer 10, having a plurality of macros or chips 12 temporarily attached thereto. The chips 12 may comprise logic chips, memory chips, i.e., DRAM, RAM, etc., analog components, and so on. For example, a DRAM chip may be mounted adjacent a memory chip, and a memory chip may be mounted adjacent an analog component, etc. Likewise, as illustrated, the chips 12 may have different sizes and shapes, and particularly, different thicknesses in the z axis.

Figure 1B:
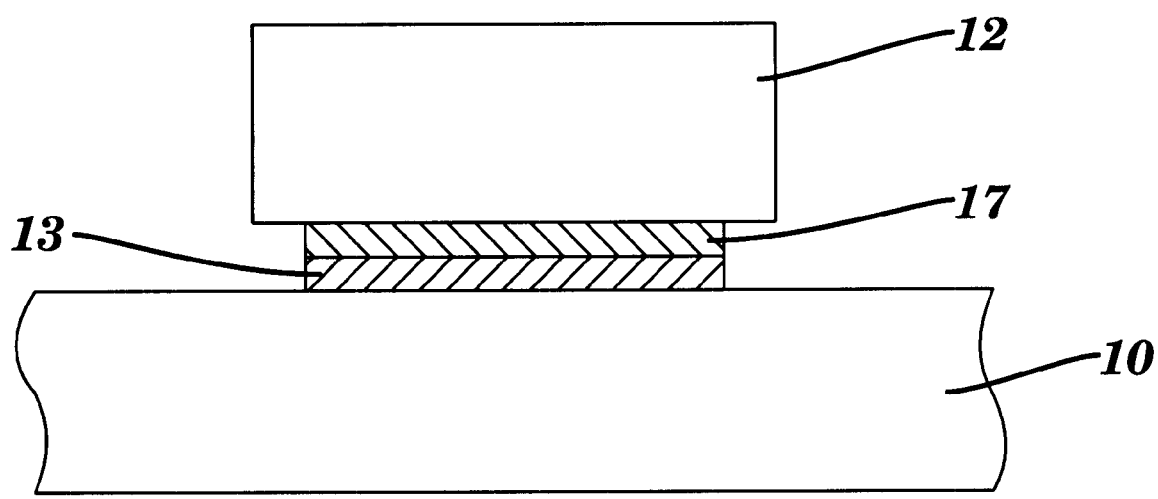
FIG. 1B depicts an enlarged cross-sectional view of an alignment pattern.

The chips 12 are temporarily attached to the alignment wafer 10 via an interlocking mechanism created by a Precision Aligned Macro (PAM) process. In particular, a photosensitive polyimide is used to form an alignment pattern 13 on the surface of the alignment wafer 10 (FIG. 1B). Likewise, a complementary alignment pattern 17 is formed on the active surface of each chip 12. A connection is then formed between the mating alignment patterns 13, 17 of the alignment wafer 10 and the chips 12. In the alternative, an oxide-to-oxide bond, surface tension, a vacuum, etc., may also be used to temporarily attach the chips 12 to the alignment wafer 10 or substrate apparatus.

The chips 12 are temporarily attached to the alignment wafer 10 to assist in the accurate alignment of the chips 12 and a support wafer during a subsequent attachment step (described infra). In particular, the alignment wafer 10 temporarily holds the chips 12 in a properly aligned attachment position as the support wafer is placed on the chips 12 (more detail will be provided below).

The chips 12 are mounted on the alignment wafer 10 such that a space or gap 15 remains between the individual chips 12 on all sides. The gaps 15 provide a path through which bonding material byproducts may escape once the chips 12 are subsequently attached to the support wafer (described infra). Otherwise, the byproducts may cause failure of the chips 12 to bind to the support wafer, or non-planar binding of the chips 12 to the support wafer.

The chips 12 are properly aligned in the x and y directions during attachment to the alignment wafer 10, for example, via the alignment patterns described above. In particular, the chips 12 are aligned having alignment tolerances of approximately 1–2 microns in the x and y directions. The alignment tolerances in the x and y directions minimize the gaps 15 between the chips 12, thereby increasing the wiring density of the structure.

An adhesion promoter (not shown), such as 3-aminopropyltriethoxysilane (available from Aldrich Chemical of Milwaukee, Wis.; and Huls of Piscataway, N.J.), may optionally be applied to the back or non-active surface of each chip 12. The adhesion promoter is a silanol containing an amine functionality, which serves to chemically modify the surface to be coated with polyimide. The adhesion promoter increases the adhesion strength between the back surface of the chips 12 and the attachment surface of the support wafer (described infra).

Figure 2:
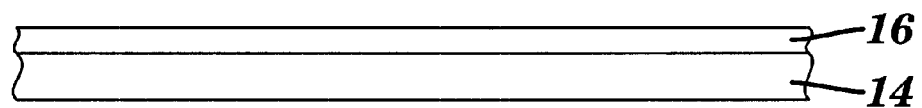
FIG. 2 depicts a support wafer having an adhesive layer thereon.

FIG. 2 shows a cross-sectional view of a support substrate or wafer 14. The support wafer 14 is comprised of silicon, or in the alternative, other similar materials used in the semiconductor packaging industry. A conformable bonding material 16, having a solvent therein, is deposited over a first or attachment surface of the support wafer 14. In this example, the bonding material 16 comprises polyimide, such as 2566 PI™ (made by DuPont), and the solvent comprises NMP (N-methyl pyrrolidone).

The solvent is added to the bonding material 16 to decrease the viscosity of the bonding material 16 during deposition. Without the addition of the solvent, the bonding material 16 may be too viscous to be accurately deposited onto the attachment surface of the support wafer 14. The bonding material 16, having the solvent therein, is deposited on the support wafer 14 using spin-on deposition techniques, wherein the bonding material 16 is spun on at a rate of approximately 1000–5000 rpm. The thickness of the bonding material 16 depends upon the viscosity, or other material characteristics, of the bonding material 16 and the speed at which the bonding material 16 is spun onto the attachment surface of the support wafer 14.

In order for the chips 12 to bind properly to the polyimide in the bonding material during attachment, a proper amount of the solvent must be present in the bonding material 16. Therefore, following deposition on the attachment surface of the support wafer 14, the bonding material 16 is baked to remove a majority of the solvent. In particular, the bonding material 16 is exposed to a temperature in the range of approximately 70–130° C. for about 30–120 seconds. Thereafter, the surface of the bonding material 16 is dry and "non-tacky."

The curing process typically removes approximately 80–90% of the solvent from the bonding material 16. Therefore, the bonding material 16 on the attachment surface of the support wafer 14 is exposed to a vapor bath containing the solvent. In particular, the support wafer 14 is placed, attachment surface and bonding material 16 down, over the bath, which has a vapor temperature of approximately 60–140° C., for approximately 30–200 seconds. The vapor bath replenishes a sufficient amount (approximately 10%) of the solvent to make the surface of the bonding material 16 slightly "tacky" in order to enhance the subsequent bonding of the chips 12 thereto. It should be noted that a lower bath temperature requires a longer exposure time.

Figure 3:
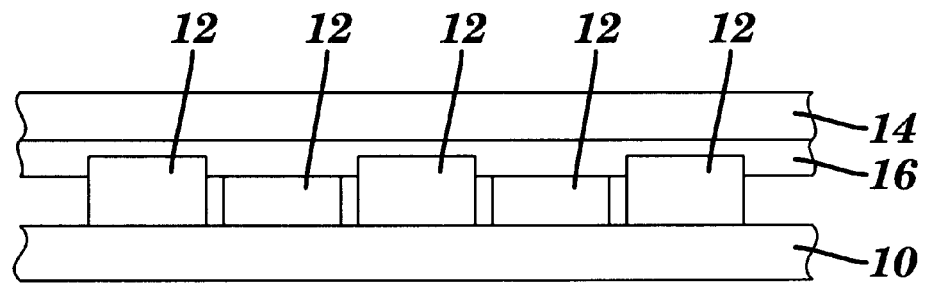
FIG. 3 depicts the attachment of the alignment substrate of FIG. 1A and the support wafer of FIG. 2.

As illustrated in FIG. 3, the support wafer 14 is then inverted and mounted on the alignment wafer 10. In particular, the back surface of the chips 12 are firmly pressed into the bonding material 16, thereby adhering the back surface of each chip 12 to the alignment wafer 10. The adhesion promoter on the back surface of each chip 12 adheres to the tacky surface of the bonding material 16 on the support wafer 14. As illustrated, the conformable bonding material 16 on the surface of the support wafer 14 deforms to accommodate the different thicknesses of each chip 12.

The bonding material 16 between the back surface of the chips 12 and the attachment surface of the support wafer 14 of the integrated semiconductor device 20 is then cured. For example, the integrated semiconductor device 20 is baked, wherein heat is applied to a back surface 22 (a surface opposite the attachment surface) of the support wafer 14. The temperature is ramped from room temperature, approximately 25° C., to approximately 200° C., for about 30 seconds to initiate imidization. (Imidization refers to the reaction between carboxylic acid and amine functionalities in the polyimide film to form imide groups. The imide groups cross-link the film and increase the molecular weight of the resin, thereby rendering the film insoluable to solvent and mechanically hardened.)

During the imidization step, by-products created by the reaction between the adhesion promoter on the back surface of each chip 12 and the bonding material 16 on the attachment surface of the support wafer 14, such as hydro-carbons and water, migrate out of the bonding material 16 through the gaps 15 surrounding the chips 12.

The integrated semiconductor device 20 is then cured in an oven by baking for about 1 hour in a temperature of approximately 300–400° C. This curing process forms covalent bonds between the bonding material 16 on the attachment surface of the support wafer 14 and the adhesion promoter on the back surface of the chips 12. In addition, the droplets formed by the migrating byproducts of the adhesion promoter and the bonding material 16 evaporate during the curing process.

During the bake, the support wafer 14 is maintained at a temperature higher than that of the alignment wafer 10. This is important because the heated polyimide within the bonding material flows to the hotter surface. By keeping the temperature of the support wafer 14 higher than that of the alignment wafer 10 the polyimide remains on the back surface of the chips 12 and provides a strong bond between the chips 12 and the support wafer 14. If the alignment wafer 10 is allowed to become hotter than the support wafer 14 the polyimide will flow from the back surface of the of the chips 12 to the face of the chips 12, thereby permanently binding the chips 12 to the alignment wafer 10 and causing a weak bond between the chips 12 and the support wafer 10.

Figure 4:
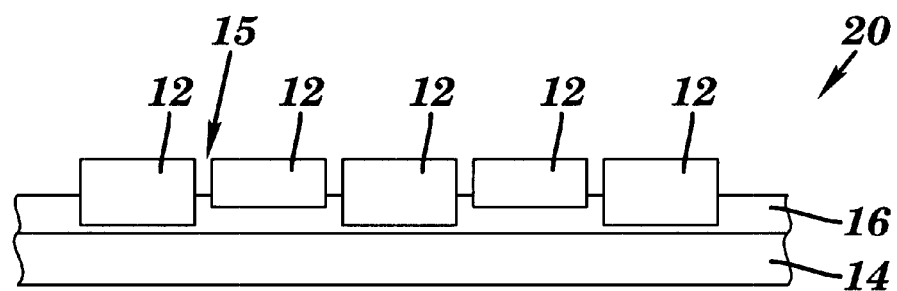
FIG. 4 depicts the support wafer of FIG. 3 following the removal of the alignment substrate.

The integrated semiconductor device 20, comprising the support wafer 14 and the chips 12, is then removed from the alignment wafer 10, as shown in FIG. 4. In particular, the temporary attachment formed between the chips 12 and the alignment wafer 10 is disengaged, thereby releasing the chips 12 from the alignment wafer 10. For example, in the event the PAM attachment technique was used, the alignment patterns on the alignment wafer 10 and each chip 12 are pulled apart, and the alignment pattern on the active surface of the chips 12 is then removed as known in the art.

As illustrated in FIG. 4, the exposed active surface of each of the chips 12 are co-planar. This is attributable to the conformable bonding material 16 in conjunction with the planar surface of the alignment wafer 10. In particular, the alignment wafer 10 establishes a planar surface to align the chips 12 during attachment to the support wafer 14. In addition, the conformable bonding material 16 deforms to allow for differences in the thickness of the chips 12. Accordingly, when the alignment wafer 10 is removed, the co-planar surface formed by the chips 12 is maintained.

Figure 5:
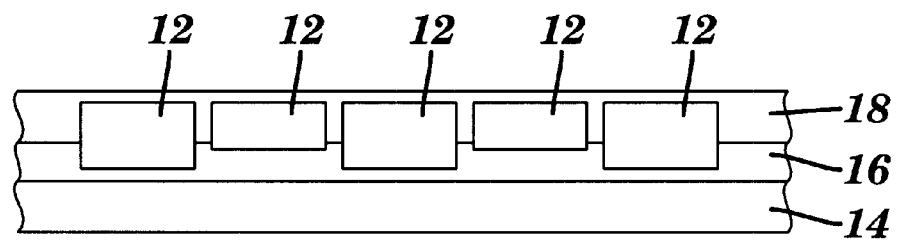
FIG. 5 depicts the support wafer of FIG. 4 having a filler material thereon.

A gap filler 18 is then deposited over the surface of the integrated semiconductor device 20 to fill in the gaps 15 between the chips 12 of the integrated semiconductor device 20, as shown in FIG. 5. The gap filler 18 comprises a material, such as an insulative material, i.e., a dielectric, an oxide, thermid, polyimide, etc., having a coefficient of thermal expansion relatively close to that of the support wafer 14 material. If a gap filler having a coefficient of thermal expansion vastly different from that of the support wafer 14 material is used (i.e., a difference greater than about 20%), the gap filler material may become deformed during the subsequent curing step (described below).

Figure 6:
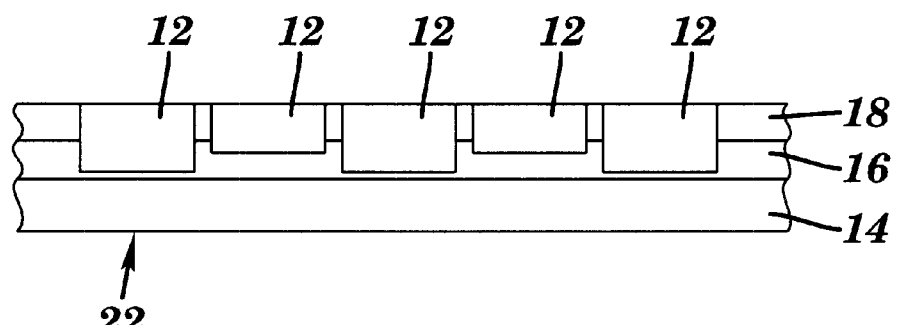
FIG. 6 depicts the support wafer of FIG. 5 following planarization.

The surface of the integrated semiconductor device 20 is then planarized, using a chemical mechanical polish (CMP) process, ashing, polishing, or a combination of ashing and polishing, to remove the excess gap filler 18 and planarize the surface of the integrated semiconductor device 20, as shown in FIG. 6.

The planarized integrated semiconductor device 20 is then cured in an oven for about 1 hour in a temperature of approximately 300–400° C. Thereafter, chip-to-chip connections (not shown) are constructed, using well known wiring techniques, between the chips 12 on the planarized front surface of the integrated semiconductor device 20. The integrated semiconductor device 20, which incorporates multiple functions into a single device, provides higher bandwidth access between the different chips, whether memory, logic, analog components, etc. Following the formation of the chip-to-chip connections, subsequent metallization layers (not shown) may be added as needed or desired.

It should be noted that the present invention provides an integrated semiconductor device 20 wherein the surface of the chips 12 mounted thereon are co-planar. As described above, this is partially attributable to the conformable nature of the bonding material 16 that affixes the chips 12 to the support wafer 14. Because the bonding material 16 is capable of varying in thickness across the surface of the support wafer 14, the bonding material 16 compensates for the variations in size, shape, thickness, etc., between adjacent chips 12 on the surface of the support wafer 14.

It should also be noted that the present invention is not intended to be limited to the orientations described and illustrated herein. For example, the alignment wafer 10, having chips 12 attached thereto, may be mounted on the support wafer 14 in an inverted position, rather than inverting the support wafer 14 as illustrated in FIG. 3, particularly when a vacuum, oxide-to-oxide bond, or other similar form of attachment is used.

While this invention has been described in conjunction with the specific embodiments outlined above, it is evident that many alternatives, modifications and variations will be apparent to those skilled in the art. Accordingly, the specific embodiments of the invention as set forth above are intended to be illustrative, not limiting. Various changes may be made without departing from the spirit and scope of the invention as defined in the following claims.

We claim:

1. A method of assembling a plurality of semiconductor devices having different thicknesses such that active surfaces of the devices are co-planar, comprising the following steps performed in the indicated sequential order:

providing a first substrate having a substantially planar surface;

temporarily mounting the active surfaces of the plurality of semiconductor devices having different thicknesses on the substantially planar surface of the first substrate, said devices being mechanically isolated from each other aside from being coupled to each other through the planar surface of the first substrate on which the devices are temporarily mounted, leaving gaps between the devices;

attaching a second substrate, having a conformable bonding material thereon, to exposed surfaces of the plurality of devices, wherein the conformable bonding material deforms to accommodate the devices having different thicknesses such that the active surfaces of the devices remain co-planar;

curing the bonding material by heating the second substrate for a period of time such that the temperature of the second substrate exceeds the temperature of the first substrate substantially throughout said period of time;

detaching the first substrate from the plurality of devices, leaving the active surfaces of the devices exposed and co-planar;

depositing a filler material over the active surfaces of the devices such that the gaps between the devices are filled with the filler material; and removing excess filler material from the devices to expose the active surfaces of the devices.

2. The method of claim 1, said heating comprising ramping the temperature of the second substrate from a temperature of approximately 25° C. to approximately 200° C. for about 30 seconds.

3. The method of claim 2, said heating further comprising baking the second substrate and plurality of devices at a temperature of approximately 300–400° C. for about 1 hour following the ramping.

4. The method of claim 1, further comprising adding a solvent to the bonding material to decrease viscosity of the bonding material prior to depositing the bonding material on the second substrate.

5. The method of claim 4, wherein the solvent comprises N-methyl pyrrolidone (NMP).

6. The method of claim 4, further comprising removing a first portion of the solvent from the bonding material.

7. The method of claim 6, comprising heating the bonding material to approximately 70–130° C. for about 30–120 seconds.

8. The method of claim 6, further comprising re-applying a second portion of the solvent to the bonding material following removal.

9. The method of claim 8, comprising exposing the bonding material to a vapor bath, having the solvent therein, for about 30–200 seconds, wherein the bath is at a temperature of approximately 60–140° C.

10. The method of claim 1, further comprising applying an adhesion promoter to the exposed surfaces of the plurality of devices before mounting the second substrate thereto.

11. The method of claim 1, wherein temporarily mounting the active surfaces of the plurality of devices on the substantially planar surface of the first substrate further comprises:

forming a plurality of mating alignment marks on the planar surface of the first substrate and the active surfaces of the plurality of devices; and mechanically interlocking the mating alignment marks of the first substrate with the mating alignment marks on the plurality of devices.

12. The method of claim 11, further comprising aligning the plurality of mating alignment marks on the planar surface of first substrate and the active surfaces of the plurality of devices in an x and y direction.

13. The method of claim 1, wherein temporarily mounting the active surfaces of the plurality of devices on the substantially planar surface of the first substrate further comprises:
providing a vacuum between the planar surface of the first substrate and the active surfaces of the plurality of devices.

14. The method of claim 1, wherein temporarily mounting the active surfaces of the plurality of devices on the substantially planar surface of the first substrate further comprises:
providing an oxide-to-oxide bond between the planar surface of the first substrate and the active surfaces of the plurality of devices.

15. The method of claim 1, wherein the first substrate comprises an alignment wafer.

16. The method of claim 1, wherein the plurality of semiconductor devices comprise chips.

17. The method of claim 16, wherein the chips are selected from the group consisting of: logic components, memory components and analog components.

18. The method of claim 1, wherein devices performing different functions are attached to the second substrate adjacent one another.

19. The method of claim 1, wherein the second substrate comprises a support wafer.

20. The method of claim 19, wherein the support wafer comprises silicon.

21. The method of claim 1, wherein the bonding material comprises polyimide.

22. The method of claim 21, wherein an initial stage of said heating initiates a chemical reaction from which the bonding material is hardened.

23. The method of claim 22, wherein by-products of the chemical reaction migrate out of the bonding material through the gaps between the devices.

24. The method of claim 1, wherein temporarily mounting the active surfaces of the plurality of devices on the substantially planar surface of the first substrate does not include mechanically interlocking the plurality of devices to the first substrate.

25. A method of forming a device, comprising the following steps performed in the indicated sequential order:
providing a first substrate having a substantially planar surface;
temporarily mounting a first surface of a plurality of semiconductor devices having different thicknesses to the planar surface of the first substrate, said devices being mechanically isolated from each other aside from being coupled to each other through the planar surface of the first substrate on which the devices are temporarily mounted, leaving gaps between the devices;
providing a second substrate having a conformable bonding material on an attachment surface of the second substrate;
joining the first and second substrates, such that the bonding material adheres to a second surface of the semiconductor devices, and wherein the bonding material deforms to accommodate devices having different thicknesses such that the first surfaces of the devices remain co-planar;
curing the bonding material by heating the second substrate for a period of time such that the temperature of the second substrate exceeds the temperature of the first substrate substantially throughout said period of time; and
removing the first substrate from the first surface of the semiconductor devices, leaving the first surfaces of the devices exposed and co-planar.

26. A method of assembling a plurality of semiconductor devices having different thicknesses such that active surfaces of the devices are co-planar, comprising the following steps performed in the indicated sequential order:
providing a first substrate having a substantially planar surface;
temporarily mounting the active surfaces of the plurality of semiconductor devices having different thicknesses on the substantially planar surface of the first substrate, said devices being mechanically isolated from each other aside from being coupled to each other through the planar surface of the first substrate on which the devices are temporarily mounted, leaving gaps between the devices;
attaching a second substrate, having a conformable bonding material thereon, to exposed surfaces of the plurality of devices;
detaching the first substrate from the plurality of devices, leaving the active surfaces of the devices exposed and co-planar;
depositing a filler material over the surface of the devices such that gaps between the devices are filled by the filler material; and
removing the excess filler material to expose the active surfaces of the devices.

* * * * *